United States Patent
Kondo

(10) Patent No.: US 10,846,176 B2
(45) Date of Patent: Nov. 24, 2020

(54) MAGNETIC DISK DEVICE AND METHOD OF CONTINUED READING OF SECTORS OF MAGNETIC DISK DEVICE EVEN AFTER AN ERROR IS DETECTED IN ONE OF THE SECTORS

(71) Applicants: TOSHIBA ELECTRONIC DEVICES & STORAGE CORPORATION, Tokyo (JP); KABUSHIKI KAISHA TOSHIBA, Tokyo (JP)

(72) Inventor: Yosuke Kondo, Fujisawa Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/291,756

(22) Filed: Mar. 4, 2019

(65) Prior Publication Data

US 2020/0081779 A1 Mar. 12, 2020

(30) Foreign Application Priority Data

Sep. 6, 2018 (JP) .................................. 2018-166982

(51) Int. Cl.
| | |
|---|---|
| *G06F 13/00* | (2006.01) |
| *G06F 11/10* | (2006.01) |
| *H03M 13/00* | (2006.01) |
| *H03M 13/25* | (2006.01) |
| *H03M 13/11* | (2006.01) |

(52) U.S. Cl.
CPC ...... *G06F 11/1076* (2013.01); *G06F 11/1044* (2013.01); *H03M 13/1148* (2013.01); *H03M 13/25* (2013.01); *H03M 13/6312* (2013.01)

(58) Field of Classification Search
CPC .......................... G06F 11/1076; G06F 11/1044
USPC ............................................................ 711/4
See application file for complete search history.

(56) References Cited

U.S. PATENT DOCUMENTS

| 5,452,311 | A | * | 9/1995 | Wells ..................... G11C 16/32 714/708 |
| 6,891,690 | B2 | | 5/2005 | Asano et al. |
| 6,993,251 | B1 | * | 1/2006 | Phillips .................... H04N 5/76 386/207 |
| 9,734,328 | B2 | * | 8/2017 | Barau ..................... G06F 21/55 |
| 2014/0118857 | A1 | * | 5/2014 | Kashiwagi ............. G11B 5/596 360/75 |
| 2015/0040226 | A1 | * | 2/2015 | Barau ................. G06F 11/1076 726/23 |
| 2016/0203041 | A1 | | 7/2016 | Galbraith et al. |

(Continued)

*Primary Examiner* — Sean D Rossiter
(74) *Attorney, Agent, or Firm* — Kim & Stewart LLP

(57) ABSTRACT

A magnetic disk device includes a magnetic disk, which includes, in a track, a plurality of first sectors each recording user data and a second sector recording parity data for restoring the user data recorded in the first sectors, and a disk controller configured to read data from a plurality of sectors including the first sectors and the second sector based on an instruction from a host, and to detect whether there is an error in each of the first sectors when the user data is read from the first sectors. The disk controller continues reading the data recorded in the plurality of sectors even when an error is detected in one of the first sectors by the disk controller.

14 Claims, 5 Drawing Sheets

(56) References Cited

U.S. PATENT DOCUMENTS

2017/0220264 A1\* 8/2017 Sokolov ................ G06F 3/0611
2017/0324430 A1 11/2017 Han et al.

\* cited by examiner (SECTOR 4) = (SECTOR 0)^(SECTOR 1)^(SECTOR 2)^(SECTOR 3)

MAGNETIC DISK DEVICE AND METHOD OF CONTINUED READING OF SECTORS OF MAGNETIC DISK DEVICE EVEN AFTER AN ERROR IS DETECTED IN ONE OF THE SECTORS

CROSS-REFERENCE TO RELATED APPLICATION

This application is based upon and claims the benefit of priority from Japanese Patent Application No. 2018-166982, filed Sep. 6, 2018, the entire contents of which are incorporated herein by reference.

FIELD

Embodiments described herein relate generally to a magnetic disk device and a data read method thereof.

BACKGROUND

As a technique for correcting an error at the time of data reading, a technique using parity data is known.

For example, the parity data is generated by executing an XOR (exclusive OR) operation on a plurality of user data. Thereafter, when there is an error in the user data, the user data can be restored by the XOR operation of other user data and the parity data.

A magnetic disk device of the related art includes a magnetic disk which includes, in a track, a plurality of sectors configured to respectively record user data and a sector configured to record parity data for restoring the user data recorded in the sectors. In a case where this type of magnetic disk device detects that an error exists in a sector of the track when the user data is read from the track, the magnetic disk device interrupts the process of reading the sector. This is because a process corresponding to the error in the sector is preferentially executed.

However, when user data are read from a track including a sector for recording parity data, the magnetic disk device interrupts the process of reading the sector when it detects an error in the sector of the track as in the case described above. In such a case, when an error correction code (ECC) error is detected in any of the sectors for which the reading is performed, since reading of all the sectors has not been performed, a situation arises that data restoration of the sector detected to have the ECC error cannot be executed.

DETAILED DESCRIPTION

Embodiments provide a magnetic disk device with improved read performance and a data read method thereof.

In general, according to one embodiment, a magnetic disk device includes a magnetic disk, which includes, in a track, a plurality of first sectors each recording user data and a second sector recording parity data for restoring the user data recorded in the first sectors, and a disk controller configured to read data from a plurality of sectors including the first sectors and the second sector based on an instruction from a host, and to detect whether there is an error in each of the first sectors when the user data is read from the first sectors. The disk controller continues reading the data recorded in the plurality of sectors even when an error is detected in one of the first sectors by the disk controller.

Hereinafter, embodiments will be described with reference to the drawings.

Figure 1:
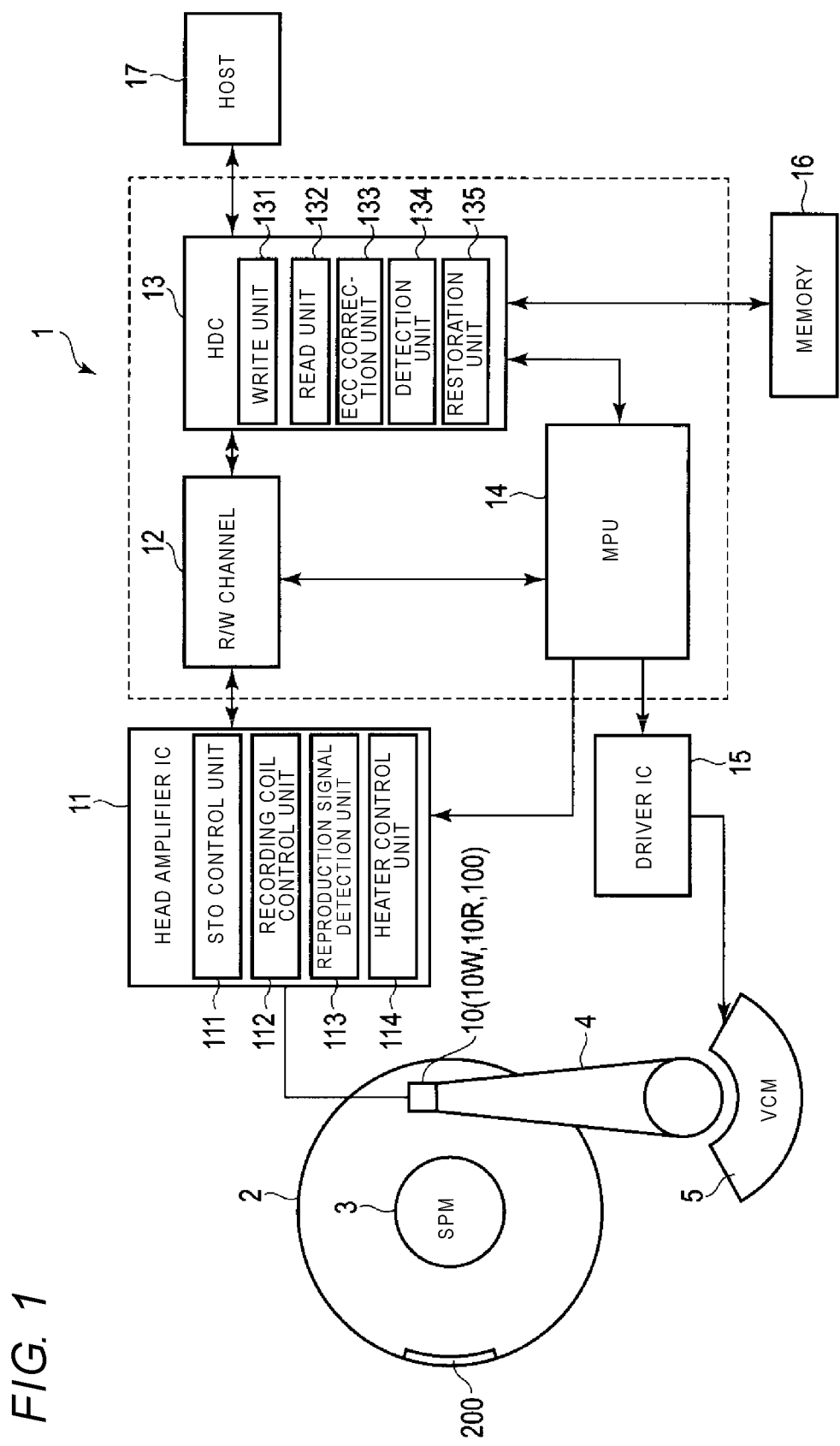
FIG. 1 is a block diagram of a magnetic disk device according to an embodiment.

FIG. 1 is a block diagram of a magnetic disk device according to an embodiment.

A magnetic disk device 1 shown in FIG. 1 is, for example, a hard disk drive (HDD), and includes a magnetic disk (hereinafter referred to as a "disk") 2, a spindle motor (SPM) 3, an actuator 4, a voice coil motor (VCM) 5, a magnetic head (hereinafter referred to as a "head") 10, a head amplifier IC 11, an R/W channel 12, a hard disk controller (HDC) 13, a microprocessing unit (MPU) 14, a driver IC 15 and a memory 16. In addition, the magnetic disk device 1 can be connected to a host computer (hereinafter referred to as a "host") 17. The head 10 includes a write head (also referred to as a recording head or a writer) 10W, a read head (also referred to as a reproduction head or a reader) 10R, and a spin torque oscillator (STO) 100 which is a high-frequency oscillation element. The R/W channel 12, the HDC 13 and the MPU 14 may be incorporated in a single chip integrated circuit.

The disk 2 includes, for example, a substrate which is formed in a disk-shape and made of a nonmagnetic material. A soft magnetic layer made of a soft magnetic material as an underlying layer, a magnetic recording layer thereon having magnetic anisotropy in a direction perpendicular to the disk surface, and a protective film layer thereon are stacked in this order on the surface of the substrate. In this case, the direction from lower to upper layers corresponds to the direction of the head 10.

The disk 2 is fixed to the spindle motor (SPM) 3 and is rotated by the SPM 3 at a predetermined speed. A plurality of disks 2 may be installed to be fixed to the SPM 3. The SPM 3 is driven by a drive current (or a drive voltage) supplied from the driver IC 15. In the disk 2, a data pattern is recorded and reproduced by the head 10. The disk 2 includes a plurality of tracks, each of which is formed with a plurality of sectors therein, and the data pattern is recorded in the plurality of sectors. One sector of a track records parity data for restoring data recorded in the plurality of sectors of the track. Further, the disk 2 has a monitor region (or evaluation region) 200. The monitor region 200 is a dedicated region for evaluating oscillation characteristics of the STO 100. The monitor region 200 is provided, for example, on a part of the outermost circumference or the innermost circumference in a radial direction of the disk 2.

The actuator 4 is installed to pivot, and the head 10 is supported at a tip end portion thereof. By pivoting the actuator 4 by the voice coil motor (VCM) 5, the head 10 is moved onto and positioned above a desired track of the disk 2. The VCM 5 is driven by a drive current (or a drive voltage) supplied from the driver IC 15.

The head 10 includes a slider, and the write head 10W and the read head 10R are formed on the slider. A plurality of heads 10 are provided in accordance with the number of disks 2.

The head amplifier IC 11 includes a circuit for driving the STO 100, detection of the oscillation characteristics, and the like. For example, the head amplifier IC 11 includes an STO control unit 111, a recording coil control unit 112, a reproduction signal detection unit 113 and a heater control unit 114. The head amplifier IC 11 executes driving of the STO 100, drive signal detection, and the like. Further, the head amplifier IC 11 supplies a write signal (e.g., in the form of a write current), corresponding to write data supplied from the R/W channel 12, to the write head 10W. In addition, the head amplifier IC 11 amplifies a read signal output from the read head 10R and transmits the amplified read signal to the R/W channel 12.

The STO control unit 111 controls a current to be supplied to the STO 100 of the write head 10W. The recording coil control unit 112 includes a recording signal pattern control unit and a recording current control unit. The recording coil control unit 112 controls a recording current supplied to a coil of the write head 10W in accordance with the write signal. The reproduction signal detection unit 113 detects a signal (corresponding to read data) reproduced by the read head 10R. The heater control unit 114 controls the power supply to a heater. That is, the heater control unit 114 switches ON/OFF of the heater.

The R/W channel 12 is a signal processing circuit configured to process a signal associated with reading/writing. The R/W channel 12 includes a read channel executing signal processing of read data and a write channel executing signal processing of write data. The R/W channel 12 converts a read signal into digital data and demodulates read data from the digital data. The R/W channel 12 encodes write data transferred from the HDC 13, and transfers the encoded write data to the head amplifier IC 11.

The HDC 13 provides an interface between the magnetic disk device 1 and the host 17, and executes transfer control of the read data and the write data. That is, the HDC 13 functions as a host interface controller which receives a signal transferred from the host 17 and transfers the signal to the host 17.

In addition, the HDC 13 includes a write unit 131, a read unit 132, an ECC correction unit 133, a detection unit 134 and a restoration unit 135. The write unit 131 controls writing of data to the disk 2 via the head 10, the head amplifier IC 11, the R/W channel 12 and the MPU 14. The read unit 132 controls reading of data from the disk 2. For example, the read unit 132 reads data from a plurality of sectors (including a sector in which parity data is recorded) from which the data is to be read, based on an instruction from the host. The ECC correction unit 133 executes ECC correction processing on data of a sector unit read by the read unit 132. When a signal is transferred to the host 17, the detection unit 134 executes, on the sector unit, a data error detection process of a reproduction signal which is read and demodulated by the head 10 according to the MPU 14. The restoration unit 135 executes restoration of data detected to have an ECC error using the parity data. The restoration unit 135 is configured to turn on/off the data restoration processing function on the basis of the instruction from the host by the HDC 13, in which the data restoration processing function is to restore the data in the error sector (the sector detected to have an error) on the basis of the parity data.

In the magnetic disk device of recent years, an ECC correction unit may be included in the R/W channel, such as an LDPC (Low Density Parity Check) decoding circuit. In this case, the ECC correction processing and the restoration process of the data detected to have the ECC error are performed in the R/W channel.

Next, the above-described error detection process will be described. The error detection process is a process of detecting an ECC error or an information addition error for each sector. The ECC error is an error that cannot be corrected by the ECC correction processing carried out by the ECC correction unit 133. Accordingly, the data of the sector containing the error which is determined to be uncorrectable by the ECC correction processing is a target of the data restoration process using the parity data. When the above-described data restoration processing function is ON, the data of the sector is restored by the restoration unit 135. The information addition error is an error detected as a result of error information being added to a sector. Therefore, such an error is detected in the sector, even when the error in the data of the sector is correctable by ECC correction processing. Here, it is assumed that the error information is added to the sector after a predetermined error process is performed, for example, when an ECC error has been detected previously, and the data is restored using parity data. The reason for adding the error information is not limited thereto. While the present embodiment shows a case where the error information is added to a sector, it is not limited thereto, and there may be various cases where a sector is determined to have an error other than an ECC error. An example of the process related to the error detection process will be described later with reference to FIG. 9.

In addition, the HDC 13 receives a command (such as a write command and a read command) transferred from the host 17, and transmits the received command to the MPU 14.

The MPU 14 is a main controller of the magnetic disk device 1 and executes control for the read/write operation and servo control necessary for positioning the head 10.

The driver IC 15 controls driving of the SPM 3 and the VCM 5 under the control of the MPU 14. By driving the VCM 5, the head 10 is positioned onto a target track on the disk 2.

The memory 16 includes a volatile memory and a non-volatile memory. For example, the memory 16 includes a buffer memory including a DRAM, and a flash memory. The memory 16 stores programs and parameters necessary for the processing of the MPU 14.

Next, an example of an action of data writing to the disk 2 and data reading will be described with reference to FIGS. 2 to 8. FIG. 4 and FIG. 6 are diagrams illustrating a comparative example and are used for a comparison with the present embodiment.

Figure 2:
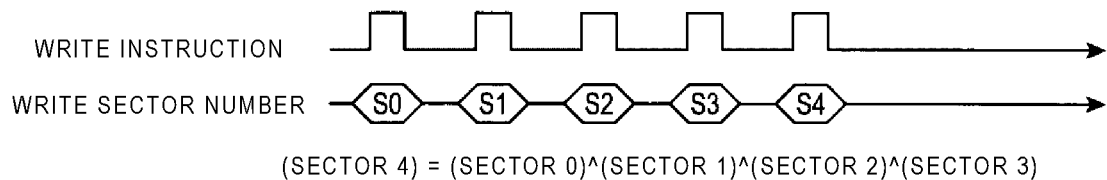
FIG. 2 is a diagram showing an example of a write operation of writing data to a plurality of sectors according to the embodiment.

FIG. 2 is a diagram showing an example of a write operation of writing data to a plurality of sectors. Specifically, an example of writing data to sectors S0 to S4 as the plurality of sectors will be described. Incidentally, sectors S0 to S3 are a first sector group configured to record user data and a sector S4 is a second sector group configured to record parity data generated by an XOR operation of the user data recorded in the sectors S0 to S3. FIG. 2 shows how the operation of writing data to the sectors S0 to S4 is executed corresponding to five write instructions. The example shown in FIG. 2 is merely an example, and the number of sectors for writing data, the amount of the parity data and the generation method are not limited thereto. For example, the XOR operation may be performed respectively at S0 and S2 as well as S1 and S3, and a plurality of parity data may be generated.

Figure 3:
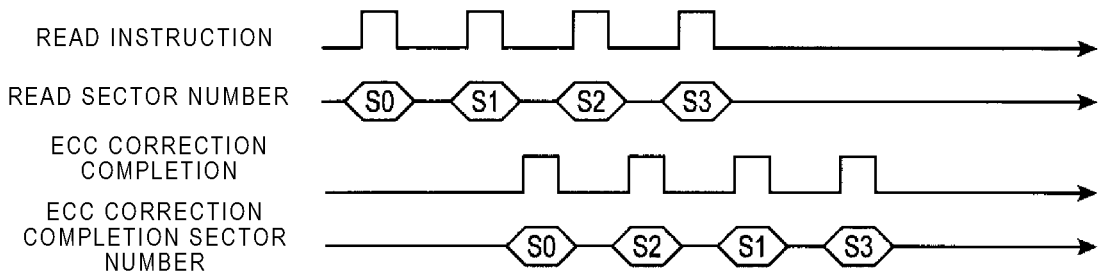
FIG. 3 is a diagram showing an example of a read operation of reading the data from the plurality of sectors according to the embodiment.
Figure 4:
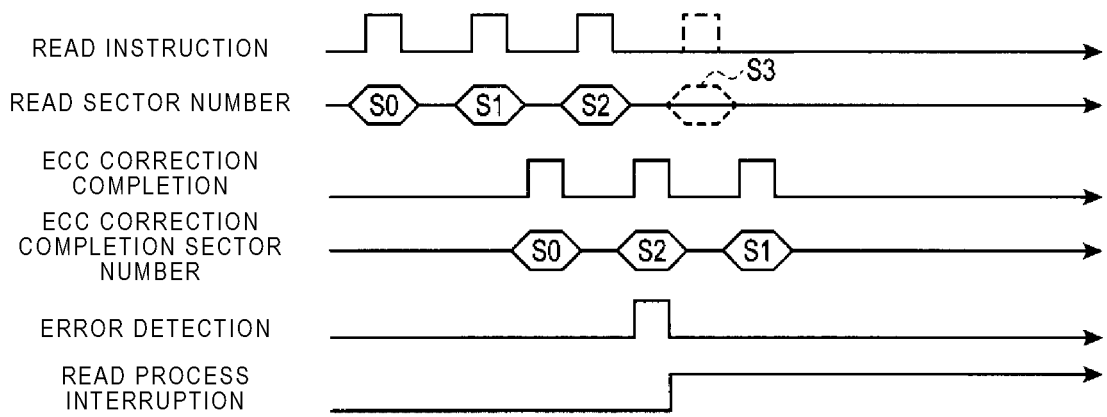
FIG. 4 is a diagram describing an example of an operation when an error is detected during data reading according to a comparative example.

FIG. 3 is a diagram showing an example of a read operation of reading data from the plurality of sectors. More specifically, FIG. 3 is the diagram showing the example of the read operation of reading data from the sectors S0 to S3 by the read unit 132 when the data restoration processing function executed by the restoration unit 135 is OFF.

Since the data restoration processing function is OFF, the reading of the sector S4 (corresponding to parity data) is not executed. Therefore, as shown in FIG. 3, the data is read from the sectors S0 to S3 corresponding to four read instructions. The ECC correction processing is executed by the ECC correction unit 133 on the read data in each sector. At this time, an order of completing the ECC correction processing is not necessarily identical with the read order. In the example shown in FIG. 3, the order of completing the ECC correction processing is sector S0, sector S2, sector S1 and sector S3 while the order of reading is sector S0, sector S1, sector S2 and sector S3, and the two orders are not identical.

Next, an example of an operation when an error is detected during data reading according to a comparative example will be described. FIG. 4 is a diagram showing an example of an operation when an error (ECC error or information addition error) is detected during the operation shown in FIG. 3.

In the comparative example shown in FIG. 4, when an error is detected, the HDC 13 performs a process corresponding to error content in the sector detected to have an error, so that the data read process is interrupted immediately after the error is detected. As shown in FIG. 4, since the error is detected before a read instruction to the sector S3 indicated by the broken line in the diagram, the read unit 132 stops transmitting the data read instruction to the sector S3. Therefore, reading data from the sector S3 indicated by the broken line in the diagram is not performed. In addition, since the ECC correction processing in the sector S1 is completed later than that of the sector S2, it is not possible to detect an error in the sector S1. Therefore, the read process is interrupted while waiting for the completion of the ECC corrections of all the sectors (i.e., the sectors S0, S1 and S2) to which the read instructions are issued, when the first error is detected. Depending on the processing of the error sector, it may not be necessary to wait for the completion of the ECC correction processing of all the sectors. However, even in such a case, the read process is interrupted while waiting for the completion of the ECC correction processing of all the sectors.

Figure 5:
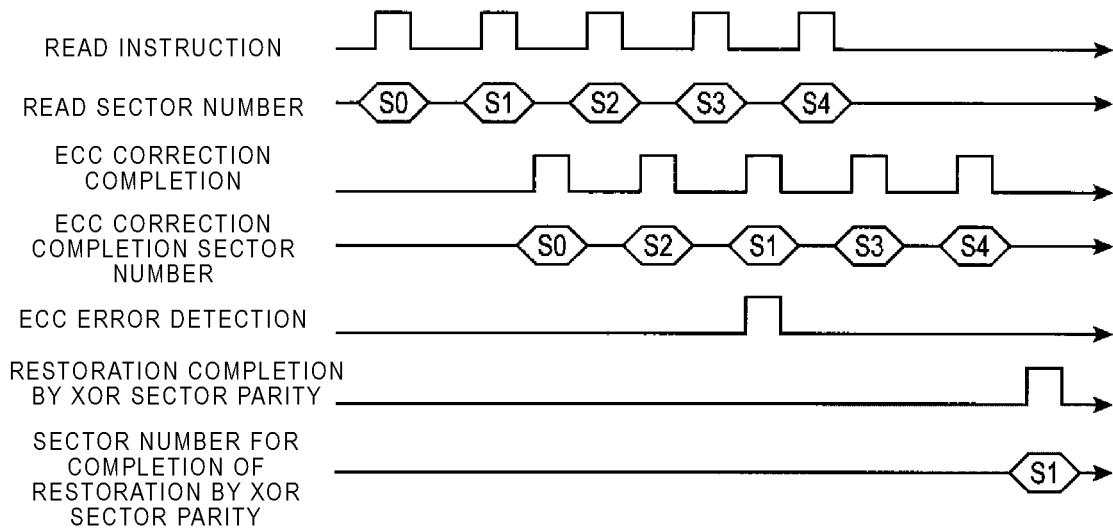
FIG. 5 is a diagram showing an example of an operation when a data read process is performed with a data restoration processing function enabled according to the embodiment.
Figure 6:
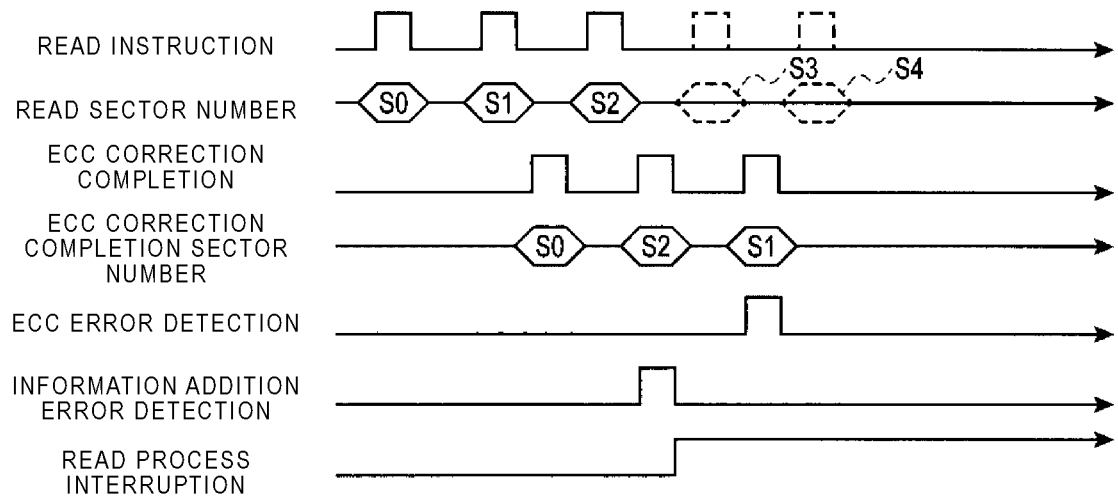
FIG. 6 is a diagram showing an example of a data read operation according to the comparative example.

FIG. 5 is a diagram showing an example of an operation to perform a data read process when the data restoration processing function is enabled, which uses the parity data to restore data in the error sector.

In the example of FIG. 5, data from five sectors of sectors S0 to S4 are read based on read instructions to the sectors S0 to S4. Since the data restoration processing function is ON, different from the case of FIG. 3, the process of reading data from the sector S4 which is an XOR parity sector is also performed. Further, the ECC correction processing is executed by the ECC correction unit 133 on the data read from each sector. The order of completing the result of the correction process is not necessarily identical with the read order as described above. In the example shown in FIG. 5, after the ECC correction processing of the sectors S0 and S2, the ECC correction processing of the sector S1 is completed. Further, although the detection unit 134 detects an ECC error in the sector S1, the read unit 132 continues reading without interrupting the data read process. The read unit 132 performs the read process up to the sector S3 and the sector S4 (which contains the parity data), and after the ECC correction processing of all the sectors is completed, the restoration unit 135 restores the data of sector S1 by an XOR operation using data of sectors other than the sector S1. In this case, when the detection unit 134 detects an information addition error instead of an ECC error, data in a sector to which the information addition error is added can be read correctly, and thus the data is not the target of data restoration using the parity data. In other words, the data of the sector detected to have the information addition error is needed for the data restoration process of the data in the sector detected to have the ECC error.

Next, in the comparative example, an operation when an information addition error is detected during the example of the operation shown in FIG. 5 will be described. FIG. 6 is a diagram showing an example of a data read operation in the comparative example when an information addition error is detected in the sector S2 during the operation shown in FIG. 5.

When the detection unit 134 detects the information addition error, the read process is interrupted and waits for the completion of the ECC correction processing of all the sectors to which the read instructions are given. Then, the HDC 13 performs a process corresponding to error content in a sector with the earliest read order among the sectors in which errors are eventually detected. In the example shown in FIG. 6, when the read unit 132 transmits five read instructions to the sectors S0 to S4 and reads the data from the sectors S0, S1 and S2, an information addition error is detected when the data is read from the sector S2, so that the subsequent data read process is interrupted. Therefore, the read instructions to the sectors S3 and S4 indicated by the broken line in the diagram are interrupted, and reading the data from the sectors S3 and S4 indicated by the broken line in the diagram is not performed. Then, the ECC correction processing is executed in the order of sectors S0, S2 and S1, and it is detected that there is an error in the result of the ECC correction processing of the sector S1.

That is, the HDC 13 first detects the information addition error in the sector S2, and thereafter detects the ECC error in the sector S1 after interrupting the read process. Therefore, as an order of the error process, handling the ECC error of the sector S1 with an earlier read order is prior to handling the error of the sector S2. Therefore, it is necessary for the HDC 13 to read the data from the sectors S3 and S4 again, wait for the result of the ECC correction processing of the sectors S3 and S4, and execute the data restoration process of the sector S1 using the sectors S0, S2, S3 and S4 (parity data). Here, if the read process is performed up to the sector S4 (parity data) without interrupting the data read process when the information addition error of the sector S2 is detected, the data restoration process of the sector S1 can be performed by one read process. However, as described above, the data read process takes a long time to read the data from the sectors S3 and S4 again.

Figure 7:
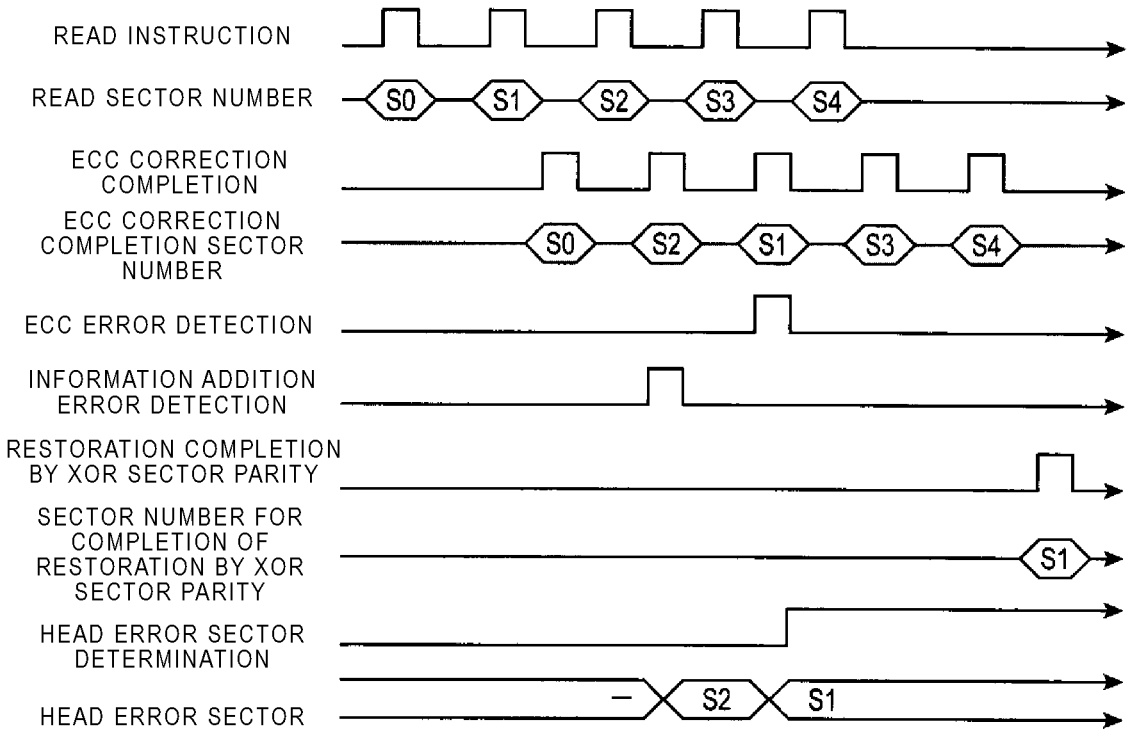
FIG. 7 is a diagram showing an example of a data read operation according to the embodiment.

Next, in the present embodiment, an operation when an information addition error is detected during the operation shown in FIG. 5 will be described. FIG. 7 is a diagram showing an example of a data read operation when the information addition error is detected in the sector S2 during the operation shown in FIG. 5.

Description on the read instructions, the read sector number, the ECC correction completion and the ECC correction completion sector number, and the detection of an ECC error in the sector S1 are all similar to those of FIG. 5. The example shown in FIG. 7 differs in that an information addition error is detected in the sector S2 in which the ECC correction processing is completed earlier than the sector S1.

The read unit 132 continues the data read process even when the information addition error is detected in the sector S2. Then, the read unit 132 records the sector S2 as a head error sector (also referred to as first error sector), for example, in a predetermined region of the memory 16 in order to record an error sector with the earliest read order. Next, the ECC correction unit 133 detects an ECC error in the sector S1. At this time point, the sector S1 is determined to be the sector with the earliest read order among the sectors detected to have an error (no error is detected in the sector S0). Further, since the error in the sector S1 is an ECC error, it is necessary to perform restoration using the parity data by the restoration unit 135. Therefore, the read unit 132 reads all the data from the sectors necessary for the restoration without interrupting the data read process. Accordingly, the read unit 132 can continuously read the data from the sectors S0, S2, S3 and S4 (parity data) without interruption. Therefore, the restoration unit 135 can restore the data of the sector S1 by one data read process without reading the data again.

Figure 8:
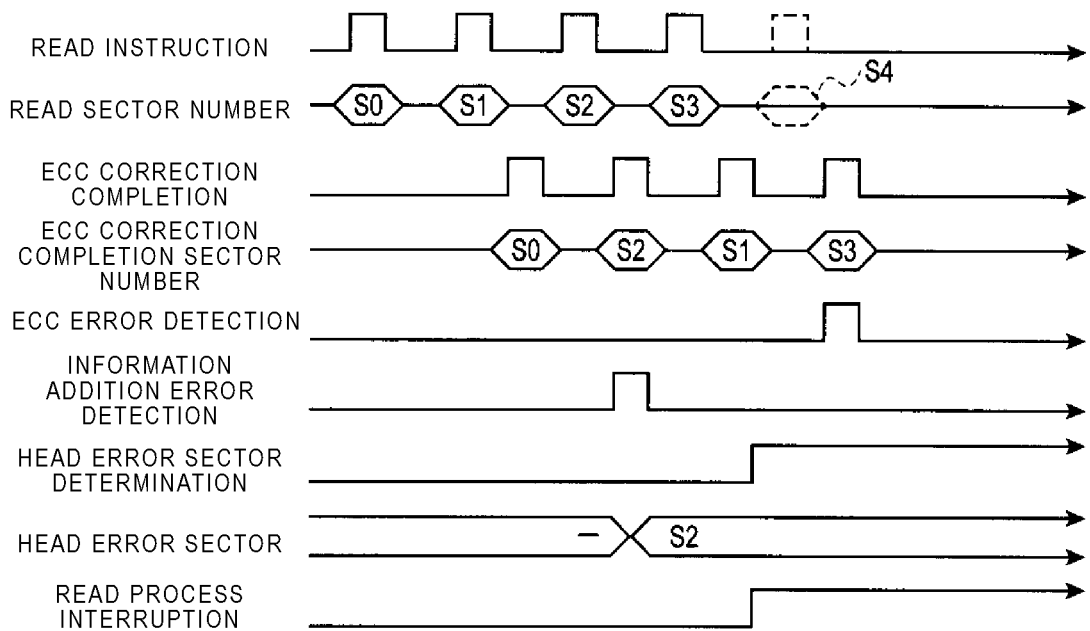
FIG. 8 is a diagram showing another example of the data read operation according to the embodiment.

Next, in the present embodiment, another operation different from the example shown in FIG. 7 when an information addition error is detected during the operation shown in FIG. 5 will be described. FIG. 8 is a diagram showing an example of an operation when an ECC error is detected in the sector S3 after the information addition error is detected in sector S2 during the operation shown in FIG. 5. The example in FIG. 8 differs from the case of FIG. 7 in that an ECC error is detected in the sector S3 instead of the sector S1.

The detection unit 134 detects the information addition error in the sector S2. Thereafter, when the ECC correction of the sector S1 is completed and no error is detected, the sector S2 is determined to be the sector (head error sector) with the earliest read order among the sectors detected to have an error. Further, since the error detected in the sector S2 is an information addition error, the data in the sector S2 is normal and it is not necessary to perform the data restoration process using the parity data of the sector S4 by the restoration unit 135. Thus, the HDC 13 interrupts the data read process. That is, the instruction to read the data from the sector S4 indicated by the broken line in the diagram is not transmitted, and the data is not read from the sector S4. Accordingly, the HDC 13 can immediately execute the error process corresponding to the information addition error detected in the sector S2.

Further, in the present embodiment, when the sector S2 is detected as an information addition error sector, it is determined that the order of reading this sector from the disk 2 is the earliest among all the error sectors (that is, the head error sector). Then, the data reading is interrupted. In other words, the read process is continued until a sector with the earliest order is determined. While such a case has been described, the present disclosure is not limited thereto. For example, the read unit 132 may continue the data read process continuously without interrupting the data read process even after the head error sector is determined. Accordingly, it is possible to read data from all the sectors and restore data in sector S3 by reading once. Accordingly, the data of the sector S3 can be restored earlier than the handling of the information addition error of the sector S2. In addition, as for whether the data read process is to be performed in the process of FIG. 7 or the process of FIG. 8, either process may be fixedly executed and the HDC 13 may change the setting as appropriate based on an instruction from the host 17.

Figure 9:
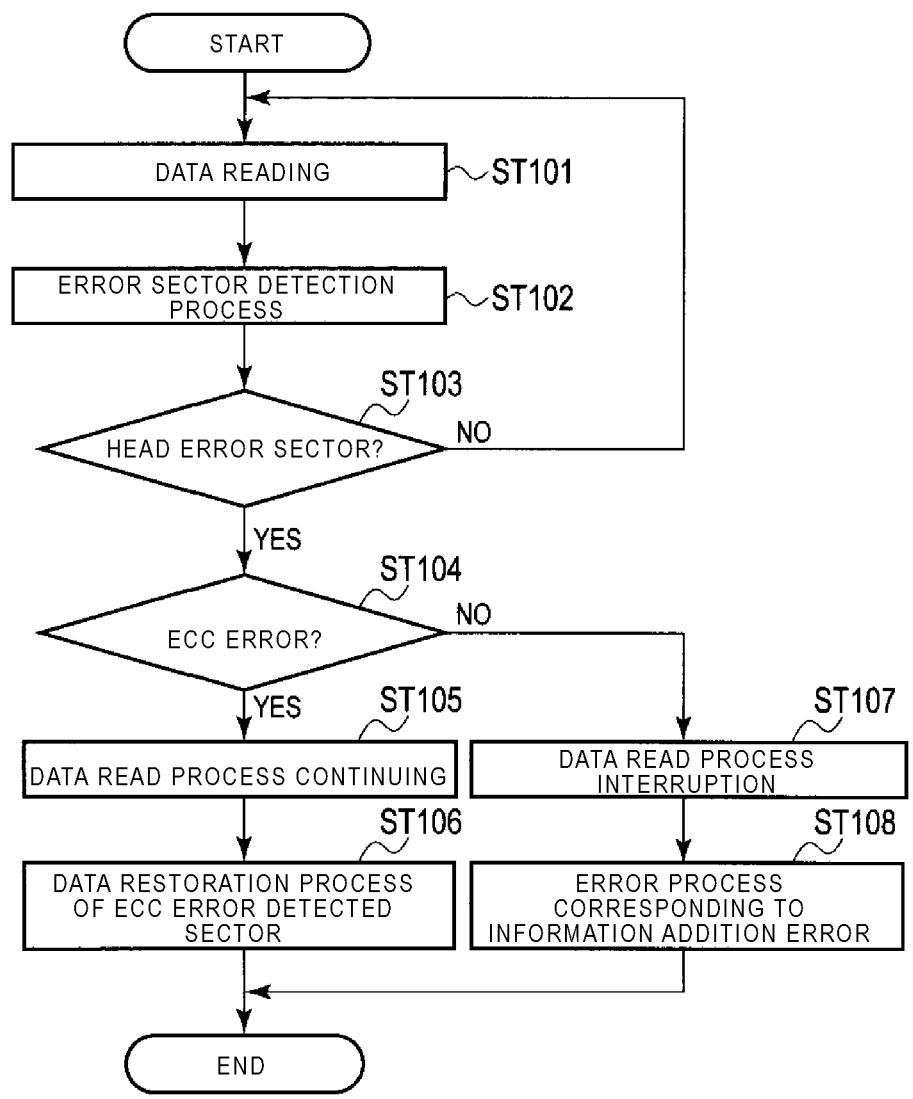
FIG. 9 is a flowchart showing an example of a process of reading data from a magnetic disk according to the embodiment.

Next, an example of a read process of the HDC 13 will be described. More specifically, a process of reading data from a plurality of sectors (including parity data) in a predetermined track based on an instruction from the host 17 will be described. FIG. 9 is a flow chart showing an example of the process corresponding to the actions of FIG. 7 and FIG. 8 described above.

As shown in FIG. 9, when receiving, from the host, an instruction to read data, the HDC 13 reads data, in a sector unit, from a plurality of sectors in a track corresponding to a range based on the instruction (ST 101). Accordingly, the data is read from each sector via the MPU 14, and the read data is output to the HDC 13.

Next, the HDC 13 executes an error sector detection process on the data of each sector output from the MPU 14 (ST 102). The error sector detection process is a process of determining whether an error is detected in each sector, and, in the present embodiment, is a process of determining whether an ECC error or an information addition error is detected in each sector.

Then, the HDC 13 determines whether a head error sector is detected (ST 103). Determining whether a sector is a head error sector is a process of determining whether a sector detected to have an error is a sector with the earliest read order among the plurality of sectors from which the data is read. As described with reference to FIG. 7, the above-described head error sector is detected using a predetermined region of the memory 16. When it is determined that the head error sector is not detected (ST 103: NO), the process returns to step ST 101. That is, the data reading is continued.

In contrast, when it is determined that the head error sector is detected (ST 103: YES), the HDC 13 determines whether the error detected in the head error sector is an ECC error (ST 104). When it is determined that the head error is an ECC error (ST 104: YES), the HDC 13 continues the data read process (ST 105). That is, a read instruction is transmitted to a sector which is not instructed to read yet, and reading of data from the sector is continued. Since the ECC error is an error in which the result of the ECC correction processing is uncorrectable, the HDC 13 executes a data restoration process of the sector detected to have the ECC error using the parity data (ST 106).

When it is determined that the error is not an ECC error (ST 104: NO), that is, when it is determined that the error is an information addition error, the HDC 13 interrupts the data read process (ST 107). Therefore, the reading of the data from the sector to which the read instruction is not transmitted from the read unit 132 is interrupted. Then, the HDC 13 executes an error process corresponding to the information addition error (ST 108). In this case, the error process corresponding to the information addition error may be set as desired. Further, when the data restoration process in step ST 106 or the error process in step ST 108 ends, the HDC 13 ends the process. When the data is read from the target sector with no error sector detected, the process is also ended.

As described above with reference to FIGS. 2 to 9, when the HDC 13 detects the information addition error sector while reading data from the plurality of sectors including the sector S4 (parity data), the HDC 13 continues the data read process from the sectors from which data are not read until it is determined that the order of reading a sector detected to have the information addition error is the earliest among the sectors detected to have an error. Accordingly, when an ECC error is detected after the information addition error is detected, and the order of reading, from the disk 2, the sector detected to have the ECC error is earlier than the order of reading the sector detected to have the information addition error, the HDC 13 continues the data reading. Therefore, the data of the sector detected to have the ECC error can be restored based on the parity data, and the data of the sector detected to have the ECC error can be restored by one read process. Therefore, the read performance of the magnetic disk device can be improved.

Further, in the above-described embodiment, the writing data to the disk 2 may be performed by a tilt magnetic recording method (also referred to as a shingled magnetic recording (SMR) method). The shingled magnetic recording method is a recording method specialized for sequential data writing and sequentially records, over a plurality of sectors, data to be respectively recorded in a plurality of sectors in a track and parity data for restoring the data to be recorded in each sector. Therefore, by applying the technique related to the data reading of the above embodiment to the magnetic disk device adopting a tile magnetic recording method, the data read performance of the magnetic disk device can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic disk device, comprising:
   a magnetic disk which includes, in a track, a plurality of first sectors each recording user data and a second sector recording parity data for restoring the user data recorded in the first sectors; and
   a disk controller configured to read data from a plurality of sectors including the first sectors and the second sector based on an instruction from a host, and for each of the first sectors, to detect whether there is an error when the user data is read therefrom and error correction processing is performed on the user data read therefrom,
   wherein
      the error that the disk controller is configured to detect is one of a first error indicating that error correction processing performed on the user data is not successful and a second error indicating that the sector from which the user data is read is an error sector, and
      the disk controller continues reading the data recorded in the plurality of sectors even when the error is detected in one of the first sectors by the disk controller.

2. The magnetic disk device according to claim 1, wherein when the first error is detected in one of the first sectors, the disk controller continues reading of the data recorded in the plurality of sectors until the parity data is read from the second sector.

3. The magnetic disk device according to claim 2, wherein the disk controller is further configured to:
   restore user data in the first sector detected to have the first error using the parity data.

4. The magnetic disk device according to claim 2, wherein when the second error is detected in a first one of the first sectors and subsequently no error is detected in a second one of the first sectors, the disk controller interrupts the reading if the first one of the first sectors is read after the second one of the first sectors.

5. The magnetic disk device according to claim 4, wherein the disk controller is configured to interrupt the reading upon detecting that the second one of the first sectors has no error.

6. The magnetic disk device according to claim 2, wherein when the second error is detected in a first one of the first sectors and subsequently the first error is detected in a second one of the first sectors, the disk controller continues reading of the data recorded in the plurality of sectors until the parity data is read from the second sector if the first one of the first sectors is read after the second one of the first sectors.

7. The magnetic disk device according to claim 1, wherein the data are recorded in the magnetic disk by a shingled magnetic recording technique.

8. A method for reading data in a magnetic disk device including a magnetic disk which includes, in a track, a plurality of first sectors each recording user data and a second sector recording parity data for restoring the user data recorded in the first sectors, the method comprising:
   reading data from a plurality of sectors including the first sectors and the second sector based on an instruction from a host; and
   for each of the first sectors, detecting whether there is an error when the user data is read therefrom and error correction processing is performed on the user data read therefrom,
   wherein
      the error that is detected is one of a first error indicating that error correction processing performed on the user data is not successful and a second error indicating that the first sector from which the user data is read is an error sector, and
      the reading of the data in the plurality of sectors is continued even when an error is detected in one of the first sectors.

9. The method according to claim 8, wherein when the first error is detected in one of the first sectors, reading of the data recorded in the plurality of sectors is continued until the parity data is read from the second sector.

10. The method according to claim 9, further comprising: restoring user data in the first sector detected to have the first error using the parity data.

11. The method according to claim 8, further comprising: when the second error is detected in a first one of the first sectors and subsequently no error is detected in a second one of the first sectors, interrupting the reading if the first one of the first sectors is read after the second one of the first sectors.

12. The method according to claim 11, further comprising: interrupting the reading upon detecting that the second one of the first sectors has no error.

13. The method according to claim 9, wherein
when the second error is detected in a first one of the first sectors and subsequently the first error is detected in a second one of the first sectors, reading of the data recorded in the plurality of sectors is continued until the parity data is read from the second sector if the first one of the first sectors is read after the second one of the first sectors.

14. The method according to claim 8,
wherein the data are recorded in the magnetic disk by a shingled magnetic recording technique.

* * * * *